(12) United States Patent
Kim et al.

(10) Patent No.: US 12,277,987 B2
(45) Date of Patent: Apr. 15, 2025

(54) ERROR HANDLING DEVICE, SEMICONDUCTOR MEMORY DEVICE INCLUDING THE SAME, AND ERROR HANDLING METHOD INCLUDING CROSS SENSING OPERATION

(71) Applicants: SK hynix Inc., Icheon (KR); Industry-Academic Cooperation Foundation Yonsei University, Seoul (KR)

(72) Inventors: Giseok Kim, Gimpo (KR); Jiyoung Kim, Seoul (KR); Wonjoon Jo, Seoul (KR); Sungho Park, Seoul (KR); Seongook Jung, Seoul (KR); Juhyun Park, Icheon (KR); Seung Ho Lee, Icheon (KR); Jungchan Lee, Icheon (KR)

(73) Assignees: SK Hynix Inc., Icheon (KR); Industry-Academic Cooperation Foundation Yonsei University, Seoul (KR)

( * ) Notice: Subject to any disclaimer, the term of this patent is extended or adjusted under 35 U.S.C. 154(b) by 211 days.

(21) Appl. No.: 18/148,357

(22) Filed: Dec. 29, 2022

(65) Prior Publication Data
US 2023/0317200 A1    Oct. 5, 2023

(30) Foreign Application Priority Data
Mar. 29, 2022    (KR) .................. 10-2022-0038679

(51) Int. Cl.
G11C 29/52    (2006.01)
G11C 11/419    (2006.01)

(52) U.S. Cl.
CPC ............ *G11C 29/52* (2013.01); *G11C 11/419* (2013.01)

(58) Field of Classification Search
None
See application file for complete search history.

(56) References Cited

U.S. PATENT DOCUMENTS

| 5,568,073 | A | * | 10/1996 | McClure | G11C 7/062 327/51 |
| 6,340,909 | B1 | * | 1/2002 | Zerbe | H03L 7/0812 327/256 |
| 8,010,864 | B2 | | 8/2011 | Tang | |

(Continued)

OTHER PUBLICATIONS

R. Naseer et al., "Parallel double error correcting code design to mitigate multi-bit upsets in SRAMs," IEEE ESSCIRC, 2008.

(Continued)

*Primary Examiner* — J. H. Hur

(57) ABSTRACT

An error handling device includes a cross-voltage sense amplifier and an error handling circuit. The cross-voltage sense amplifier is configured to perform a normal sense operation and a cross sense operation. The normal sense operation generates normal sense data by providing an input voltage and a comparison voltage to first and second inputs of a comparator, respectively. The cross sense operation generates cross sense data by providing the input voltage and the comparison voltage to the second and first inputs of the comparator, respectively. The error handling circuit identifies a location of an error using the normal sense data and the cross sense data and corrects the error.

13 Claims, 5 Drawing Sheets

(56) References Cited

U.S. PATENT DOCUMENTS

| | | | |
|---|---|---|---|
| 10,096,354 B1 | 10/2018 | Chevallier et al. | |
| 2003/0020093 A1* | 1/2003 | Itaka | G11C 7/12 |
| | | | 257/192 |
| 2013/0148443 A1* | 6/2013 | Hold | G11C 7/08 |
| | | | 365/189.15 |
| 2016/0276000 A1* | 9/2016 | Khayatzadeh | G11C 7/06 |
| 2018/0166131 A1* | 6/2018 | Chen | G11C 11/418 |

OTHER PUBLICATIONS

Yang J, et al. "Double Sensing Scheme With Selective Bitline Voltage Regulation for Ultralow-Voltage Timing Speculative SRAM" IEEE JSSC, 2018.

* cited by examiner

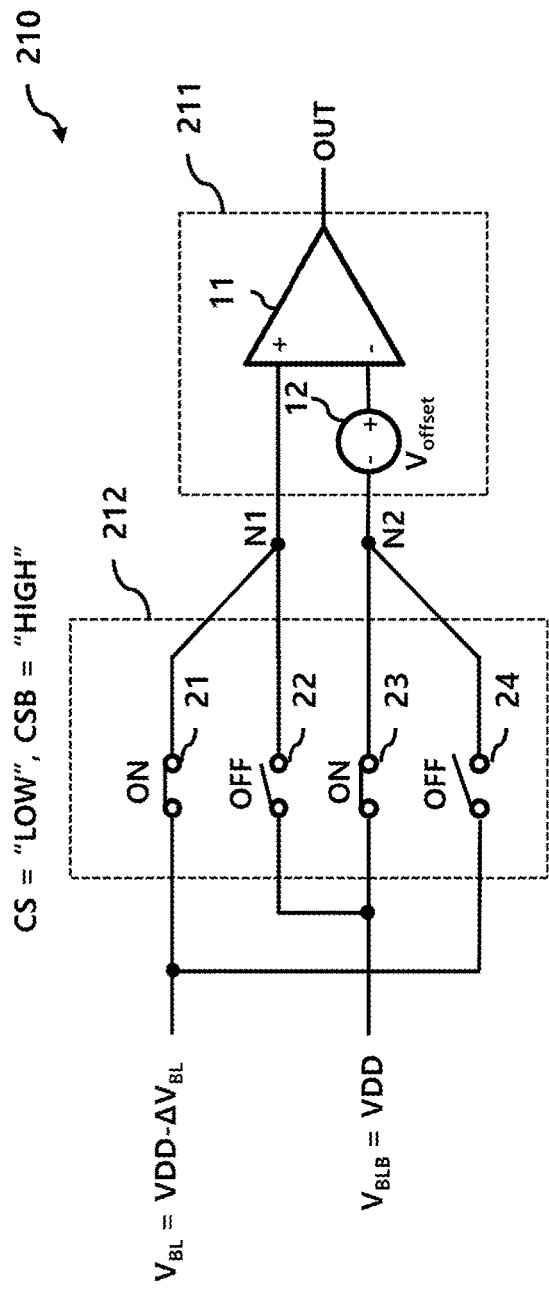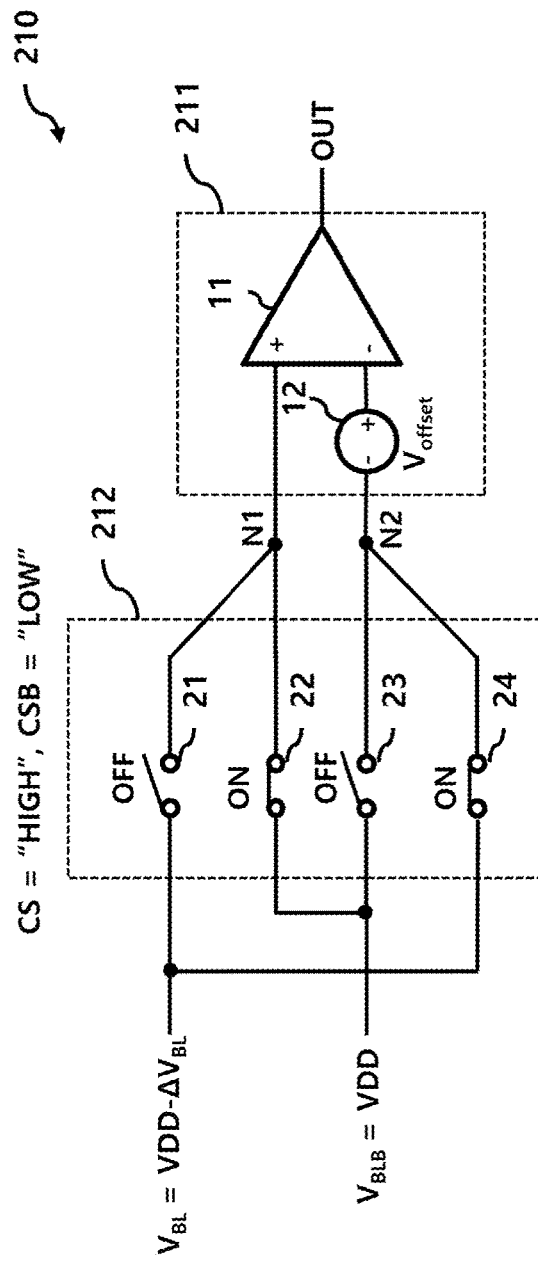
FIG. 3A
FIG. 3B

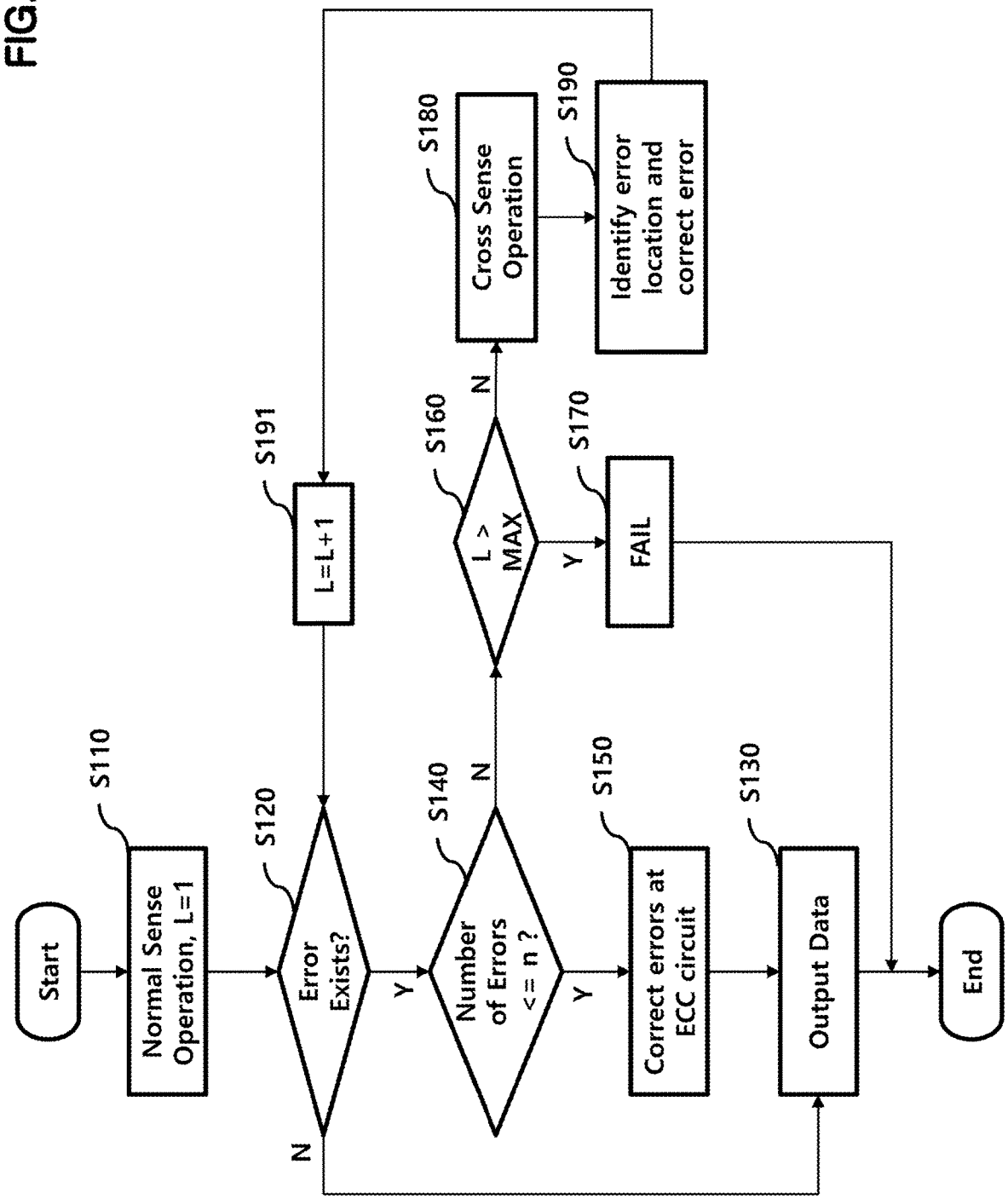

ERROR HANDLING DEVICE, SEMICONDUCTOR MEMORY DEVICE INCLUDING THE SAME, AND ERROR HANDLING METHOD INCLUDING CROSS SENSING OPERATION

CROSS-REFERENCE TO RELATED APPLICATIONS

The present application claims priority under 35 U.S.C. § 119(a) to Korean Patent Application No. 10-2022-0038679, filed on Mar. 29, 2022, which is incorporated herein by reference in its entirety.

BACKGROUND

1. Technical Field

Various embodiments relate to an error handling device, a semiconductor memory device including the error handling device, and an error handling method, and more particularly, to an error handling device, a semiconductor memory device including the error handling device, and an error handling method capable of improving read error correction performance.

2. Related Art

In the case of a memory device used in a harsh environment, such as SRAM used in a vehicle, there is a high probability that an error occurs during a read or write operation. Accordingly, it is necessary to produce a more reliable product that can reduce errors, but this may cause the yield of the product to be lowered.

During a read operation, an error correction code is applied to data output from the memory device to detect and correct an error, thereby improving reliability and increasing product yield.

However, conventional error handling circuits, such as a single error correction and double error detection (SECDED) circuit, have limited error handling capability compared to their error detecting capability.

Accordingly, a more complex circuit may be used to increase the error handling capability, but as a result, the yield of the product may be lowered and the cost increased.

SUMMARY

In accordance with an embodiment of the present disclosure, an error handling device may include a cross-voltage sense amplifier configured to perform a normal sense operation to generate normal sense data by comparing an input voltage and a comparison voltage and perform a cross sense operation to generate cross sense data by exchanging and comparing the input voltage and the comparison voltage according to a cross sense signal; and an error handling circuit configured to identify a location of an error by using the normal sense data and the cross sense data and to correct the error.

In accordance with an embodiment of the present disclosure, a semiconductor memory device may include a memory cell array configured to provide an input voltage through a bit line according to a signal output from a memory cell; a cross-voltage sense amplifier configured to perform a normal sense operation to generate normal sense data by comparing the input voltage and a comparison voltage and perform a cross sense operation to generate cross sense data by exchanging and comparing the input voltage and the comparison voltage according to a cross sense signal; and an error handling circuit configured to identify a location of an error by using the normal sense data and the cross sense data and to correct the error.

In accordance with an embodiment of the present disclosure, an error handling method may include determining if an error exists in a normal sense data generated by comparing an input voltage and a comparison voltage; generating a cross sense data by exchanging and comparing the input voltage and the comparison voltage when number of errors is greater than a predetermined number; determining if an error exists in the normal sense data by comparing the normal sense data and the cross sense data; and correcting an error if an error exists in the normal sense data.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to illustrate embodiments that include various features, and explain various principles and beneficial aspects of those embodiments.

FIGS. 3A and 3B illustrate operations of the cross-voltage sense amplifier according to an embodiment of the present disclosure.

FIG. 5 is a flowchart illustrating an operation of the error handling device circuit according to an embodiment of the present disclosure.

DETAILED DESCRIPTION

Various embodiments will be described below with reference to the accompanying figures. Embodiments are provided for illustrative purposes and other embodiments that are not explicitly illustrated or described are possible. Further, modifications can be made to embodiments of the present disclosure that will be described below in detail.

Figure 1:
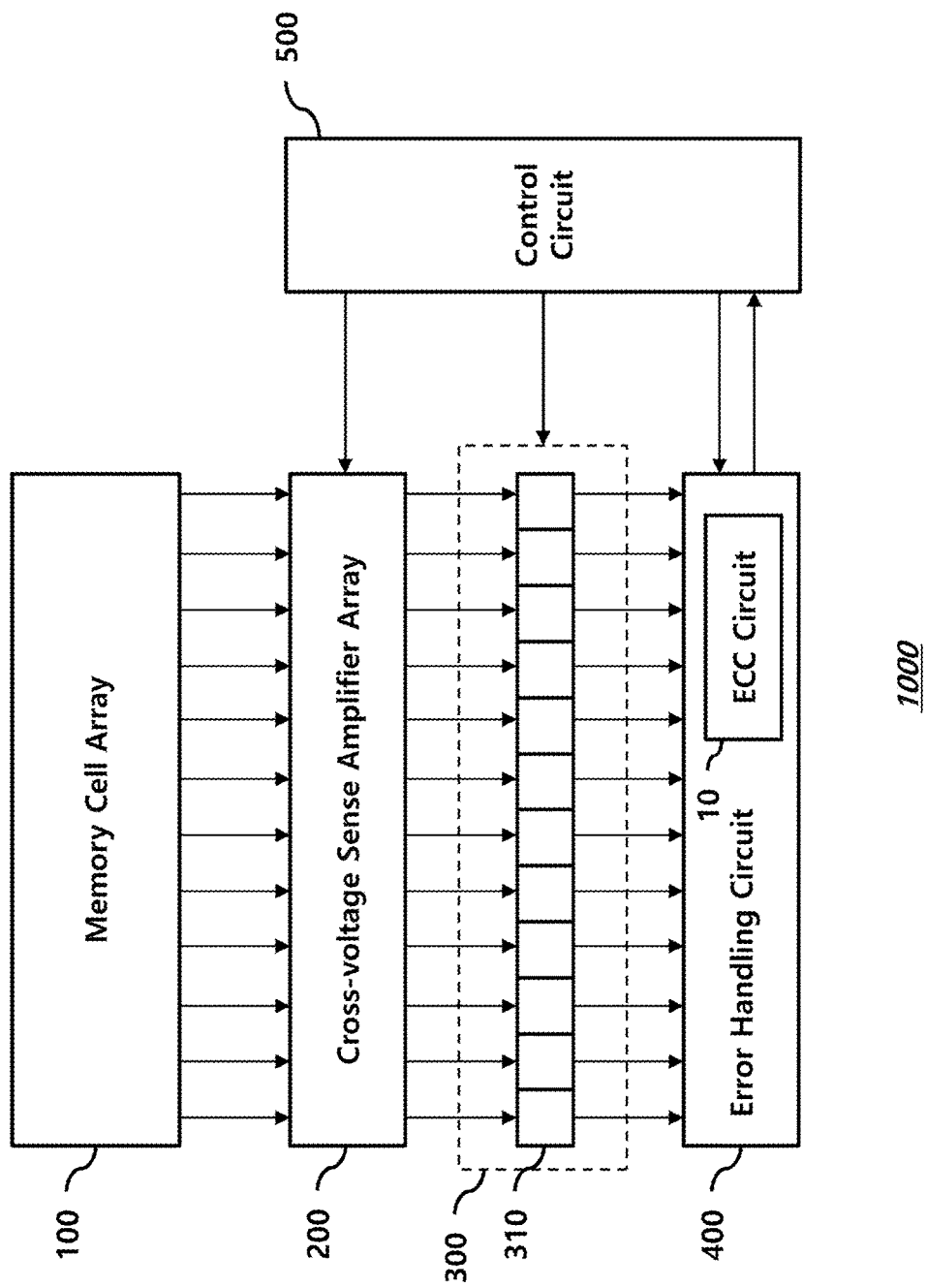
FIG. 1 illustrates a semiconductor memory device according to an embodiment of the present disclosure.

FIG. 1 is a block diagram illustrating a semiconductor memory device 1000 according to an embodiment of the present disclosure.

The semiconductor memory device 1000 includes a memory cell array 100, a cross-voltage sense amplifier array 200, a register array 300, an error handling circuit 400, and a control circuit 500.

The memory cell array 100 includes a plurality of memory cells disposed in the form of a matrix. In the embodiment described herein, a memory cell is assumed to be a SRAM cell, but embodiments are not limited to a memory cell of a specific technology.

The memory cell array 100 comprises a plurality of bit lines arranged in a column direction.

The plurality of bit lines are connected to the cross-voltage sense amplifier array 200 comprising a plurality of cross-voltage sense amplifiers.

The plurality of cross-voltage sense amplifiers sense a plurality of bit line signals and provide sensing results thereof to the register array 300 comprising a plurality of registers 310.

The error handling circuit 400 detects an error in data output from the register array 300, and corrects the error.

In this embodiment, the error handling circuit 400 includes the ECC circuit 10 and improves the error handling capability of the ECC circuit 10.

The ECC circuit 10 is able to detect m bits of errors and is able to correct n bits of errors, where m and n are natural numbers and m is greater than n.

Hereinafter, a SECDED circuit is disclosed as an example of the ECC circuit 10, but the ECC circuit 10 is not limited to the SECDED circuit.

The SECDED circuit is an example of an ECC circuit 10 where m is 2 and n is 1.

Hereinafter, the ECC circuit 10 may be referred to as the SECDED circuit 10.

The control circuit 500 controls the error detection and correction operation by controlling the cross-voltage sense amplifier array 200, the register array 300, and the error handling circuit 400 according to outputs of the error handling circuit 400.

In this embodiment, the error handling circuit 400 is controlled through the control operation of the control circuit 500 to improve the error correction capability of a SECDED circuit 10. This will be disclosed in detail below.

The semiconductor memory device 1000 may further include peripheral circuits such as a row control circuit, a column control circuit, a command decoder, and the like to read and write data in the memory cell array 100.

These peripheral circuits are well known in the art, therefore detailed description thereof is omitted.

Figure 2:
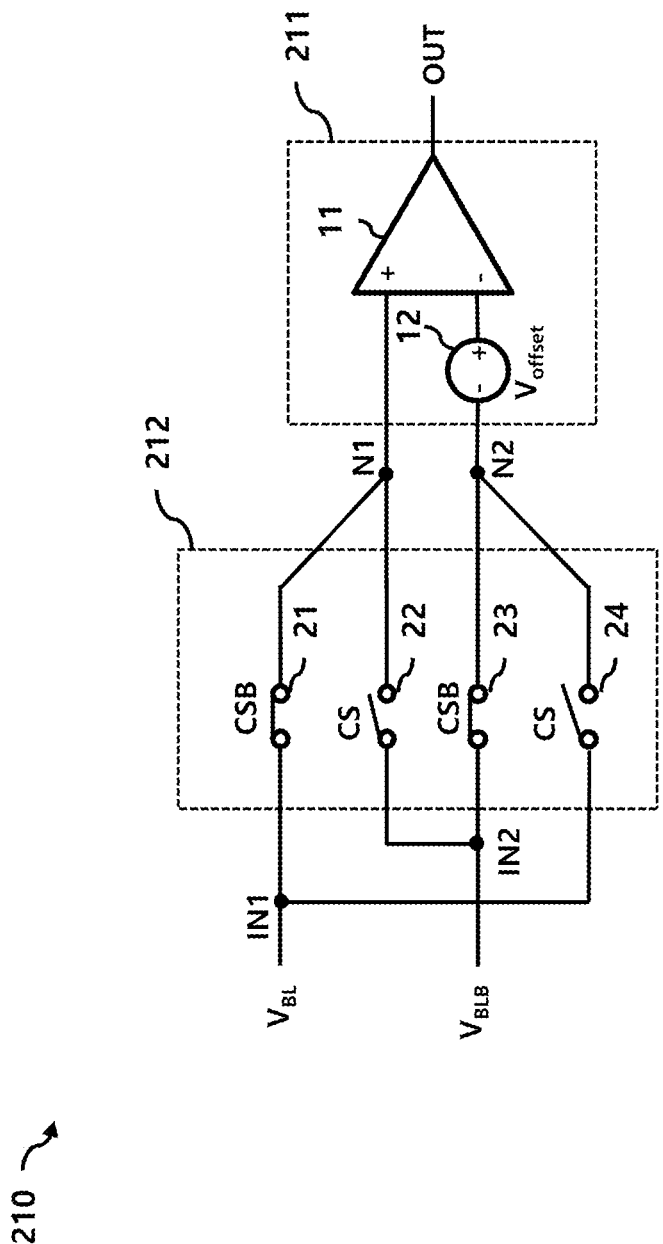
FIG. 2 illustrates a cross-voltage sense amplifier according to an embodiment of the present disclosure.

FIG. 2 is a circuit diagram illustrating a cross-voltage sense amplifier 210 according to an embodiment of the present disclosure.

The cross-voltage sense amplifier 210 includes a sense amplifier 211 and a cross circuit 212.

The sense amplifier 211 compares a voltage of a first node N1 and a voltage of a second node N2.

The sense amplifier 211 has an offset component between the two nodes N1 and N2 and the offset component is characterized by an offset voltage $V_{offset}$.

Accordingly, in FIG. 2, the sense amplifier 211 is conceptually represented as an ideal sense amplifier 11 and an offset voltage source 12.

The cross circuit 212 provides signals of a first input node IN1 and a second input node IN2 to the first node N1 and the second node N2 according to a cross sense signal CS and, in the illustrated embodiment, a cross sense bar signal CSB corresponding to an inversion of the cross sense signal CS.

The first input node IN1 is connected to a bit line BL, and bit line voltage $V_{BL}$ is received therefrom, and the second input node IN2 is connected to a bit line bar BLB and bit line bar voltage $V_{BLB}$ is received therefrom.

The cross circuit 212 includes a first switch 21 and a second switch 22 connecting the first input node IN1 or the second input node IN2 to the first node N1, and a third switch 23 and a fourth switch 24 connecting the second input node IN2 or the first input node IN1 to the second node N2. The first to fourth switches 21 to 24 may be any appropriate devices of the related arts, such as a Field Effect Transistor.

The second switch 22 and the fourth switch 24 are controlled according to the cross sense signal CS, and the first switch 21 and the third switch 23 are controlled according to the cross sense bar signal CSB.

For example, if the cross sense signal CS is at a low level, the first switch 21 and the third switch 23 are turned on, and the second switch 22 and the fourth switch 24 are turned off.

Accordingly, the first input node IN1 is connected to the first node N1 and the second input node IN2 is connected to the second node N2 when the cross sense signal CS is at the low level.

On the other hand, if the cross sense signal CS is at a high level, the first switch 21 and the third switch 23 are turned off, and the second switch 22 and the fourth switch 24 are turned on.

Accordingly, the first input node IN1 is connected to the second node N2 and the second input node IN2 is connected to the first node N1 when the cross sense signal CS is at the high level.

When the offset voltage $V_{offset}$ is smaller than the voltage difference between the first node N1 and the second node N2, the output voltage OUT is changed if the voltages of the first node N1 and the second node N2 are exchanged.

In contrast, when the offset voltage $V_{offset}$ is greater than the voltage difference between the first node N1 and the second node N2, the output voltage OUT is not changed though the voltages of the first node N1 and the second node N2 are exchanged.

FIGS. 3A and 3B are illustrate operations of the cross-voltage sense amplifier 210.

In the illustrated example, the bit line voltage $V_{BL}$ decreases from the power supply voltage VDD by the sense voltage $\Delta V_{BL}$, and the bit line bar voltage $V_{BLB}$ is the same as the power supply voltage VDD.

In this example, the bit line voltage $V_{BL}$ may be referred to as an input voltage, and the bit line bar voltage $V_{BLB}$ may be referred to as a comparison voltage.

FIG. 3A corresponds to an operation during which the cross sense signal CS is at the low level.

Accordingly, the bit line voltage $V_{BL}$ of the first input node IN1 is provided to the first node N1, and the bit line bar voltage $V_{BLB}$ of the second input node IN2 is provided to the second node N2.

Hereinafter, this is referred to as a normal sense operation and the output voltage OUT generated by the normal sense operation may be referred to as normal sense data.

FIG. 3B corresponds to an operation during which the cross sense signal CS is at the high level.

Accordingly, the bit line voltage $V_{BL}$ of the first input node IN1 is provided to the second node N2, and the bit line bar voltage $V_{BLB}$ of the second input node IN2 is provided to the first node N1.

Hereinafter, this will be referred to as a cross sense operation and the output voltage OUT generated by the cross sense operation may be referred to as cross sense data.

When there is no error in the memory cell and a first value (such as a low value) is stored in the memory cell, the sense voltage $\Delta V_{BL}$ is greater than the offset voltage $V_{offset}$, and as a result the output voltage from the normal sense operation (that is, the normal sense data) and the output voltage output from the cross sense operation (that is, the cross sense data) are different.

However, when there is an error in the memory cell, the sense voltage $\Delta V_{BL}$ is not large enough, and the offset voltage $V_{offset}$ may be larger than the sense voltage $\Delta V_{BL}$, and as a result, the output voltage in the normal sense operation (the normal sense data) and the output voltage in the cross sense operation (the cross sense data) becomes the same.

Figure 4:
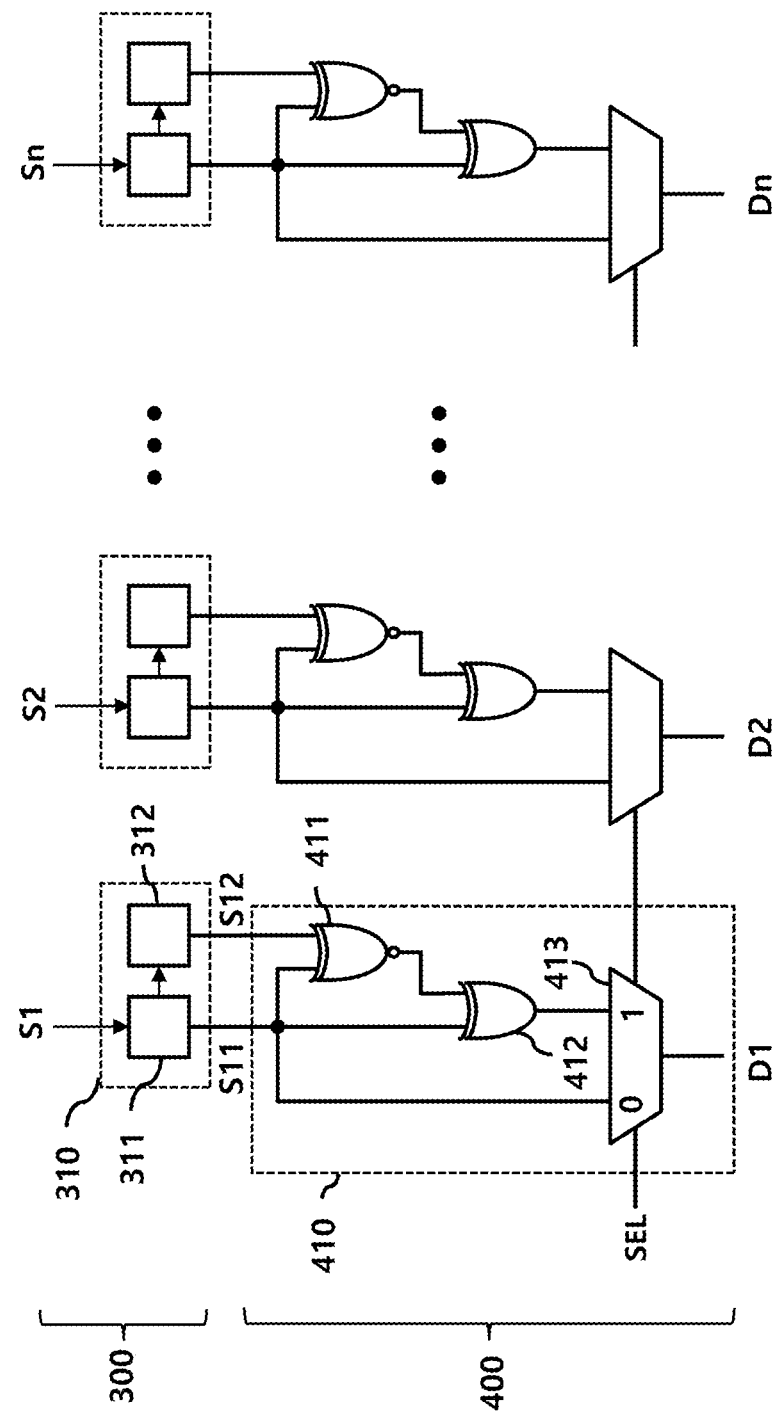
FIG. 4 illustrates a register array and an error handling circuit according to an embodiment of the present disclosure.

FIG. 4 illustrates the register array 300 and the error handling circuit 400.

The register array 300 includes a register 310 that receives a sense data S1 output (corresponding to the output voltage OUT of FIG. 3) from the cross-voltage sense amplifier 210.

The register 310 includes a first register 311 and a second register 312.

The first register 311 stores the sense data S1 to output the first sense data S11, and the second register 312 stores the output of the first register 311 to output a second sense data S12.

For example, when a cross sense operation is performed subsequent to a normal sense operation, a result of the normal sense operation is stored in the second register S12 and a result of the cross sense operation is stored in the first register S11.

The error handling circuit 400 includes a unit error handling circuit 410 that receives outputs of the register 310 to handle an error.

The unit error handling circuit 410 includes an XNOR gate 411 receiving outputs of the first and second registers 311 and 312, and a XOR gate 412 receiving outputs of the XNOR gate 411 and the first register 311, and a selection circuit 413 that selects one of the outputs of the first register 311 and the XOR gate 412 according to the selection signal SEL.

The XNOR gate 411 outputs a low level signal when the outputs of the first register 311 and the second register 312 are the same, and outputs a high level signal when they are different.

In the present embodiment, it is determined that there is no error if the results of the normal sense operation and the cross sense operation are different, and it is determined that there is an error if the results are the same.

Accordingly, when the output of the XNOR gate 411 is at the high level, it indicates that an error has occurred, and when the output of the XNOR gate 411 is at the low level, it indicates that an error has not occurred.

The XOR gate 412 outputs the other data as it is when one data is at the low level, and outputs inversion of the other data when the one data is at the high level.

Accordingly, if the output of the XNOR gate 412 is at the low level, that is, if there is no error, the output of the second register 312 is output as it is, and if the output of the XNOR gate 412 is at the high level, that is, if there is an error, an output of the register 312 is inverted and output.

The selection signal SEL becomes the high level when the cross sense operation is performed, and become the low level when the normal sense operation is performed. Accordingly, the selection signal SEL may be the same as the cross sense signal CS.

Accordingly, the selection circuit 413 generates the output data D1 by selecting an output of the first register 311 when the normal sense operation is performed, and selecting an output of the XOR gate 412 when the cross sense operation is performed.

The SECDED circuit 10 performs a 1-bit error correction operation and a 2-bit error detection operation from the outputs of the plurality of unit error handling circuits 400 when the normal sense operation is performed.

The control circuit 500 controls the cross-voltage sense amplifier array 200, the register array 300, and the error handling circuit 400 to perform a cross sense operation when the SECDED circuit 10 detects a 2-bit error.

As a result, data output from the error handling circuit 400 becomes data where 2-bit error is corrected.

More generally, when the ECC circuit 10 has an error detection capability of m bits and an error correction capability of n bits, error handling capability can be improved so that errors from n+1 bits to m bits can also be handled according to the control operation of the control circuit 500.

FIG. 5 is a flowchart illustrating an operation of the semiconductor memory device 1000.

First, a normal sense operation is performed and a loop count L is initialized as 1 at S110.

Next, it is determined whether there is an error in the ECC circuit 10 at S120.

If there is no error, data is output at S130 and the process is terminated.

If there is an error, it is determined whether number of errors is less than or equal to n at S140, where n is the number of errors the ECC circuit 10 can correct.

If the number of errors is less than or equal to n, the ECC circuit 10 corrects the errors at S150, outputs data at S130, and the process is terminated.

If the number of errors is greater than n, it is determined whether the loop count is greater than a maximum loop count MAX at S160, where the maximum loop count MAX may be a predetermined natural number.

If the loop count L is greater than the maximum loop count MAX, the fail process is performed at S170 and the process is terminated.

If the loop count is not greater than the maximum loop count MAX, a cross sense operation is performed at S180.

Thereafter, as described above, an error location is identified using the results of the normal sense operation and the cross sense operation as described above, and the error is corrected at S190.

After operations at S190, the loop count L is increased by 1 at S191 and it is determined whether an error exists using the ECC circuit 10 at S120 and the aforementioned procedures are repeated.

Although various embodiments have been described for illustrative purposes, it will be apparent to those skilled in the art that various changes and modifications may be made to the described embodiments without departing from the spirit and scope of the disclosure as defined by the following claims.

What is claimed is:

1. An error handling device comprising:
a cross-voltage sense amplifier configured to:
perform a normal sense operation to generate normal sense data by comparing an input voltage and a comparison voltage, and
perform a cross sense operation to generate cross sense data by exchanging and comparing the input voltage and the comparison voltage according to a cross sense signal; and
an error handling circuit configured to identify a location of an error by using the normal sense data and the cross sense data and to correct the error,
wherein the cross-voltage sense amplifier comprises:
a sense amplifier configured to generate an output voltage according to voltage difference between two input voltages provided to a first node and a second node; and
a cross circuit configured to:
provide the input voltage to the first node and the comparison voltage to the second node when the normal sense operation is being performed, and
provide the comparison voltage to the first node and the input voltage to the second node when the cross sense operation is being performed.

2. The error handling device of claim 1, wherein the error handling circuit comprises an error correction code (ECC) circuit having m-bit error detection capability and n-bit error correction capability wherein m and n are natural numbers and m is greater than n, wherein the cross-voltage sense amplifier performs the cross sense operation when number of errors detected at the ECC circuit is greater than n and less than or equal to m, and wherein the error handling circuit identifies the location of the error by comparing the normal sense data and the cross sense data and corrects the error.

3. The error handling device of claim 1, further comprising a first register storing the cross sense data and a second register storing the normal sense data.

4. The error handling device of claim 3, wherein the error handling circuit comprises:
  a first logic circuit configured to detect an error by comparing outputs of the first register and the second register; and
  a second logic circuit configured to output an output of the first register or to output inversion of an output of the first register according to an output of the first logic circuit.

5. The error handling device of claim 4, wherein the error handling circuit further comprises a selection circuit configured to select an output of the first register or an output of the second logic circuit according to the cross sense signal.

6. A semiconductor memory device comprising:
  a memory cell array configured to provide an input voltage through a bit line according to a signal output from a memory cell;
  a cross-voltage sense amplifier configured to:
    perform a normal sense operation to generate normal sense data by comparing the input voltage and a comparison voltage, and
    perform a cross sense operation to generate cross sense data by exchanging and comparing the input voltage and the comparison voltage according to a cross sense signal; and
  an error handling circuit configured to identify a location of an error by using the normal sense data and the cross sense data and to correct the error,
  wherein the cross-voltage sense amplifier comprises:
    a sense amplifier configured to generate an output voltage according to voltage difference between two input voltages provided to a first node and a second node; and
    a cross circuit configured to:
      provide the input voltage to the first node and the comparison voltage to the second node when the normal sense operation is being performed, and
      provide the comparison voltage to the first node and the input voltage to the second node when the cross sense operation is being performed.

7. The semiconductor memory device of claim 6, wherein the error handling circuit comprises an error correction code (ECC) circuit having m-bit error detection capability and n-bit error correction capability wherein m and n are natural numbers and m is greater than n, wherein the cross-voltage sense amplifier performs the cross sense operation when number of errors detected at the ECC circuit is greater than n and less than or equal to m, and wherein the error handling circuit identifies the location of the error by comparing the normal sense data and the cross sense data and corrects the error.

8. The semiconductor memory device of claim 6, further comprising a first register storing the cross sense data and a second register storing the normal sense data.

9. The semiconductor memory device of claim 8, wherein the error handling circuit comprises:
  a first logic circuit configured to detect an error by comparing outputs of the first register and the second register; and
  a second logic circuit configured to output an output of the first register or to output inversion of an output of the first register according to an output of the first logic circuit.

10. The semiconductor memory device of claim 9, wherein the error handling circuit further comprises a selection circuit configured to select an output of the first register or an output of the second logic circuit according to the cross sense signal.

11. An error handling method comprising:
  generating normal sense data by comparing an input voltage and a comparison voltage;
  determining whether a first error exists in the normal sense data;
  determining a number of errors for the normal sense data; and
  when the number of errors is greater than a predetermined number:
    generating cross sense data by exchanging and comparing the input voltage and the comparison voltage;
    determining whether a second error exists in the normal sense data by comparing the normal sense data and the cross sense data; and
    correcting the second error when the second error exists in the normal sense data.

12. The error handling method of claim 11,
  wherein determining whether the second error exists includes determining that the second error exists when the normal sense data is the same as the cross sense data, and
  wherein correcting the second error includes correcting the second error by inverting the normal sense data.

13. The error handling method of claim 11, determining whether the first error exists includes detecting the first error by using an ECC circuit having m-bit error detection capability and n-bit error correction capability wherein m and n are natural numbers and m is greater than n, and the predetermined number is n.

* * * * *